United States Patent [19]

Hall

[11] Patent Number: 5,061,981
[45] Date of Patent: * Oct. 29, 1991

[54] DOUBLE DIFFUSED CMOS WITH SCHOTTKY TO DRAIN CONTACTS

[76] Inventor: John H. Hall, 3169 Payne Ave., No. 50, San Jose, Calif. 95117

[*] Notice: The portion of the term of this patent subsequent to Apr. 24, 2007 has been disclaimed.

[21] Appl. No.: 500,227

[22] Filed: Mar. 27, 1990

Related U.S. Application Data

[63] Continuation of Ser. No. 53,303, May 22, 1987, abandoned.

[51] Int. Cl.⁵ .................... H01L 27/02; H01L 29/48; H01L 29/56
[52] U.S. Cl. ........................................ 357/42; 357/15; 357/43; 357/44; 357/86
[58] Field of Search ...................... 357/42, 15, 43, 44, 357/46, 86

[56] References Cited

U.S. PATENT DOCUMENTS

| | | | |
|---|---|---|---|
| 4,513,309 | 4/1985 | Cricchi | 357/42 |
| 4,593,458 | 6/1986 | Adler | 357/42 |
| 4,677,735 | 7/1987 | Malhi | 357/42 |

FOREIGN PATENT DOCUMENTS

| | | | |
|---|---|---|---|
| 58-223362 | 12/1983 | Japan | 357/15 |
| 60-74561 | 4/1985 | Japan | 357/15 |

Primary Examiner—Andrew J. James
Assistant Examiner—Ngan V. Ngo
Attorney, Agent, or Firm—Henry K. Woodward

[57] ABSTRACT

This is an invention for a complementary transistor pair which includes an n-channel double-diffused-metal-oxide-semiconductor transistor having a source, a drain and an insulated gate. A Schottky barrier junction diode is formed to the drain of the n-channel transistor. The transistor pair also includes a p-channel double-diffused-metal-oxide-semiconductor transistor which also has a source, a drain and an insulated gate. A second Schottky barrier junction diode is formed to the drain of the p-channel transistor. The two Schottky diodes are electrically coupled to one another.

4 Claims, 3 Drawing Sheets 5,061,981

DOUBLE DIFFUSED CMOS WITH SCHOTTKY TO DRAIN CONTACTS

RELATIONSHIP TO OTHER APPLICATIONS

This application is a file wrapper continuation of U.S. patent application Ser. No. 053,303 filed Mar. 22, 1987 now abandoned.

FIELD OF THE INVENTION

This invention relates to the field of integrated circuits. More particularly, this invention relates to CMOS technology formed using DMOS transistors.

BACKGROUND OF THE INVENTION

The use of CMOS technologies is desirable in certain circumstances because of the reduced power consumption. CMOS has the highest performance of any of the presently developed MOS structures. The transistor structures in conventional CMOS circuits have inherent moderate transconductance which tends to limit the speed of the technology. In addition conventional CMOS transistor circuits rely almost exclusively on majority carriers for current flow and transistor switching.

N-channel DMOS transistors have been experimented with and utilized in integrated circuits. It is known and understood that a Schottky contact to the n-channel DMOS drain will speed up the performance of the n-channel DMOS transistor by introducing minority carriers into the channel. However, such Schottky DMOS transistors are presently being developed as high speed discrete power transistors.

It is an object of the present invention to provide a circuit structure for an integrated circuit device which consumes no more power than conventional CMOS integrated circuits.

It is another object of the present invention to provide a low-power integrated circuit which is significantly faster, on the order of five times, than conventional CMOS integrated circuits.

It is yet another object of the present invention to provide a low-power CMOS integrated circuit technology which also utilizes injected majority and minority carriers to enhance current flow and switching.

SUMMARY OF THE INVENTION

The present invention includes a complementary pair of metal-oxide-semi-conductor transistors including a semi-conductor substrate an n-channel DMOS transistor formed in said substrate having a first source, a first drain (of opposite polarity, p-type) and a first insulated gate electrode member. A first conductive material is formed over the first drain forming a first Schottky barrier junction diode adjacent to the drain. A p-channel DMOS transistor is formed having a second source, a second drain(of opposite polarity, n-type), an a second insulated gate. A second Schottky barrier junction diode is formed adjacent to the second drain. The metallic regions of the two Schottky barrier junction diodes are electrical coupled together in order to form a typical complementary MOS structure.

BRIEF DESCRIPTION OF THE DRAWINGS

The cross-section diagrams shown in FIG. 1, FIG. 3, and FIG. 5 each have a substantial number of similar elements. Like-referenced numerals will be used. For the circuit diagrams of FIG. 2, FIG. 4, and FIG. 6 like-referenced numerals will be used for similar elements.

DETAILED DESCRIPTION OF THE PREFERRED EMBODIMENT

Figure 1:
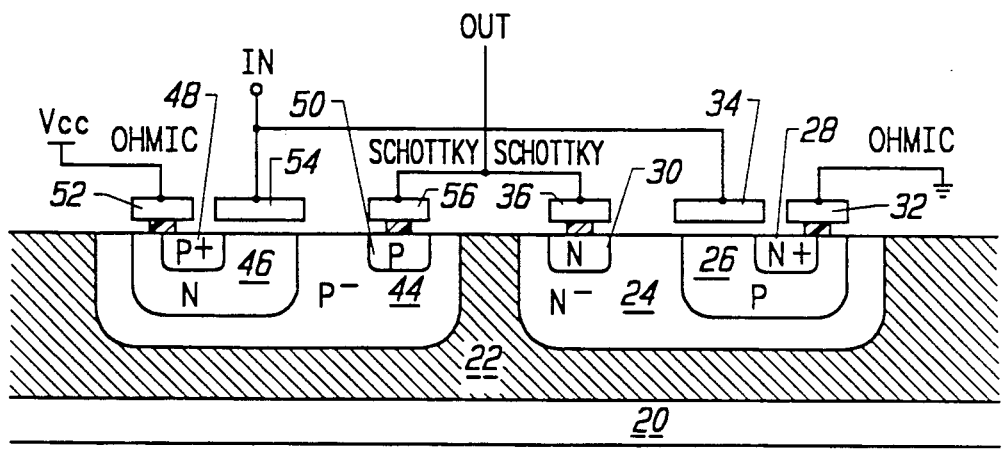
FIG. 1 is a cross-section of the preferred embodiment of the present invention.

The structure of the preferred embodiment of the present invention is shown in cross-section, in FIG. 1. On a semiconductor substrate 20 an insulating region 22 can be formed. A well 24 of n-type material is formed in the body of the insulating region 22 by a variety of well known dielectric isolation processes. Entirely within the well is formed another well of p-type material 26. A n-type source pocket 28 is formed entirely within the p-type well 26. Entirely within the n-well 24 and spaced apart from the p-well 26 is an n-type Drain diffusion pocket 30.

A conductive contact 32 forms an ohmic contact to both the n-type pocket 28 and to the p-well 26. Another conductive region (the gate electrode) 34 is insulated from the surface of the semiconductor material and covers that portion of the p-well 26 extending between the n-type pocket 28 and the edge of the p-well closest to the n-type pocket 30. A conductive material 36 is formed connected to the n-type pocket 30 forming a Schottky barrier junction diode.

A similar structure is formed in the insulative layer 22 adjacent to the first structure, but spaced apart by a portion of the insulating layer 22. A well 44 of p-type material is formed in the surface of the insulating region 22 spaced apart from n-well 24. Entirely within the well 44 is formed another well of n-type material 46. A p-type source diffusion pocket 48 is formed entirely within the n-type well 46. Entirely within the p-well 44 and spaced apart from the n-well 46 is a p-type drain diffusion pocket 50.

A conductive contact 52 forms an ohmic contact to both the p-type source 48 and to the n-well 46. Another conductive region, the gate electrode 54 is insulated from the surface of the semiconductor material and covers that portion of the n-well 46 extending between the p-type drain 48 and the edge of the n-well closest to the p-type pocket 50. A conductive material 56 is formed which is connected to the p-type pocket 50 forming a Schottky barrier junction diode.

The n-channel DMOS transistor operates as follows: contact 32 is connected to a specified voltage, preferably ground. Contact 32 and the n-type pocket 28 act as a source for this DMOS transistor. The contact 32 is connected to both the n-type pocket 28 and the p-type well 26 in order to electrically tie the p-well 26 to a known voltage level. The n-type pocket 28 is of a sufficiently high doping concentration to form an ohmic contact between contact 32 and the semiconductor material. The contact 36, the n-type pocket 30, the Schottky diode therebetween, and the n-type well 24 all operate as the drain of the DMOS transistor. The channel is that region of the p-type well 26 which is covered by the insulated gate electrode member 34. In order to form a channel for current flow between the source and drain regions a sufficiently high positive voltage is applied to the insulated gate electrode member 34 to invert the p-type semiconductor in the channel region to an n-type semiconductor for as long as that positive voltage is applied to the gate. Upon application of the appropriate gate voltage, current may flow between the source and drain regions. P-type dopants are repelled from the surface underneath the gate member and n-type dopants are drawn from the n-type pocket 28, the n-well 24 and the n-pocket 30 into the channel region to form a conductive n-type channel.

If the drain contact, were only an ohmic contact the source drain current flow would be primarily majority carrier current. Once the gate voltage were removed from the gate electrode member 34 a finite amount of time would be required for those electrons within the channel region to reach their destination in the drain before the DMOS n-channel end channel transistor and its current flow would shut off. A high speed is desired in electronics circuits and so an improvement is needed in order to speed the operating characteristics of this transistor. The speed of the device is governed by Cdg/gm, where gm is defined by the physical dimensions of the structure and the majority carrier mobility in the silicon.

By using a Schottky contact to the drain in this n-channel DMOS transistor, the current flow is no longer just majority carrier current. There is also a significant minority carrier component of the current flow. In other words, electrons would flow from the source to the drains and holes will be flowing from the drain to the p-well causing bipolar injection to take place at the n-source forming a parallel bipolar NPN transistor. The sum of these two currents, is equal to the total DMOS transistor current. Because of the limited concentration of minority carrier current upon removal of the gate voltage the electrons and hole pairs will combine rapidly. As electron-hole pairs form, and because the inversion layer is no longer being induced by a gate voltage the transistor shuts off more quickly than without the minority carrier current. In other words, the minority carriers no longer need to continue to traverse the entire channel region in order for the transistor to shut off. N-channel DMOS transistors with Schottky drain contacts have been measured to be as much as five times faster than their ohmic drain contact counterparts, due to their higher gm and low storage time.

The p-channel Schottky DMOS transistor operates in a similar fashion. The charges, signs and doping types are simply interchanged.

Figure 2:
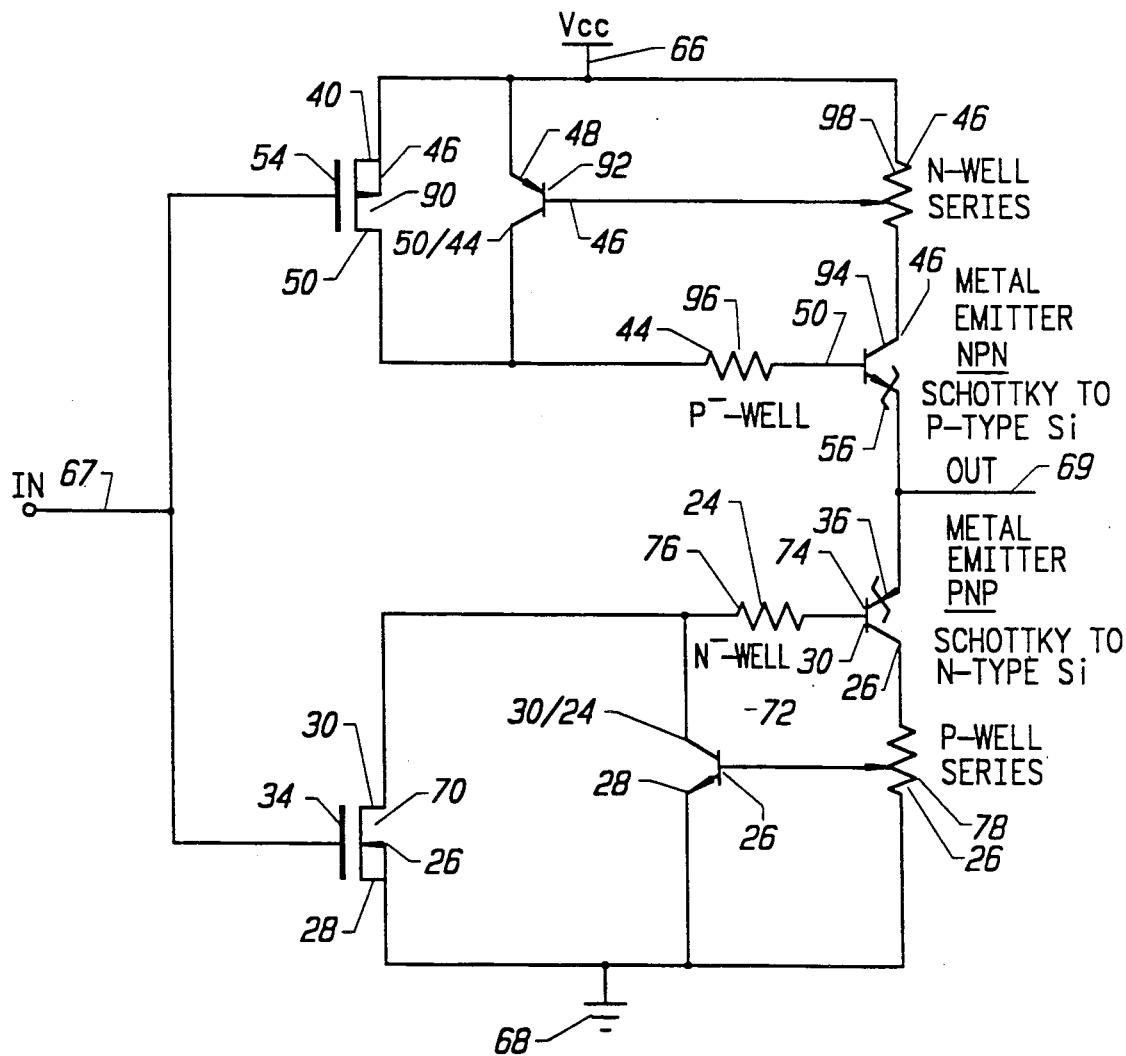
FIG. 2 is an equivalent circuit schematic of the preferred embodiment of the present invention.

FIG. 2 shows an equivalent circuit model for the device shown in FIG. 1. The n-channel DMOS transistor is shown as transistor 70. The drain of DMOS transistor 70 is connected to the collector of the parasitic NPN transistor 72 and to one terminal of the parasitic resistor 76. The source of DMOS transistor 70 is connected to the emitter of NPN transistor 72 and to a terminal of the parasitic resistor 78. The other terminal of resistor 76 is connected to the base of the parasitic PNP transistor 74. The other terminal of resistor 78 is connected to the collector of PNP transistor 74. The emitter of transistor 74 is connected to the output 69 of the circuit. The base of transistor 72 is connected to and is part of resistor 78.

N-channel DMOS transistor 70 is also labeled with its component parts as relative to FIG. 1. The gate 34 is shown to be the same gate 34 as in FIG. 1. The drain is shown to be the n-type pocket 30 and the source as n-type pocket 28. The clamping of the p-well with contact 32 is shown by the additional arrow in the transistor symbol labeled 26 to show that it is the p-type well in FIG. 1. The collector of parasitic NPN transistor 72 is formed of the contiguous n-type regions 24 and n-type pocket 30. The base of transistor 72 is formed of the p-well 26. The emitter of transistor 72 is formed by the n-pocket 28. The emitter of the PNP transistor 74 is formed of the Schottky barrier diode contact 36. The base of the PNP transistor 74 is formed by the n-well 24. The collector of transistor 74 is formed by the p-well 26. Because the n-well 24 will preferably be lightly doped there will be a resistance associated with the n-well 24 which in some circumstances may not be ignored in circuit analysis. That resistance is shown as resistor 76 connected between the base of parasitic PNP transistor 74 and the collector of parasitic NPN transistor 72 as well as the drain of n-channel DMOS transistor 70. The resistance 78 associated with the moderately doped p-type well 26 is shown to be connected between the collector of PNP transistor 74 and the ground terminal 68. That resistance also forms part of the base of an NPN transistor 72.

The p-channel DMOS transistor has a similar reciprocal equivalent circuit. The p-channel DMOS transistor is shown as transistor 90. The source of DMOS transistor 90 is connected to the emitter of the parasitic PNP transistor 92 and to one terminal of the parasitic resistor 98. The drain of DMOS transistor 90 is connected to the collector of PNP transistor 92 and to a terminal of the parasitic resistor 96. The other terminal of resistor 96 is connected to the base of the parasitic NPN transistor 94. The other terminal of resistor 98 is connected to the collector of NPN transistor 94. The emitter of transistor 94 is connected to the output 69 of the circuit. The base of transistor 92 is connected to and is part of resistor 98.

P-channel DMOS transistor 90 is also labeled with its component parts as relative to FIG. 1. The gate 54 is shown to be the same gate 54 as in FIG. 1. The source is shown to be the p-type pocket 48 and the drain as p-type pocket 50. The clamping of the n-well with contact 52 is shown by the additional arrow in the transistor symbol labeled 46 to show that it is the n-type well in FIG. 1. The collector of parasitic PNP transistor 92 is formed of the contiguous p-type regions 44. The base of transistor 92 is formed of the n-well 46. The emitter of transistor 92 is formed by the p-pocket 48. The emitter of the NPN transistor 94 is formed of the Schottky barrier diode contact 56. The base of the NPN transistor 94 is formed by the p-well 44. The collector of transistor 94 is formed by the n-well 46. Because the p-well 44 will preferably be lightly doped there will be a resistance associated with the p-well 44 which in some circumstances may not be ignored in circuit analysis. That resistance is shown as resistor 96 connected between the base of parasitic NPN transistor 94 and the collector of parasitic PNP transistor 92 as well as the source of p-channel DMOS transistor 90. The resistance associated with the moderately doped n-type well 46 is shown to be connected between the collector of NPN transistor 94 and the power supply terminal 66. That resistance also forms part of the base of an PNP transistor 92. As shown in both FIGS. 1 and 2 the gate electrode members 34 and 54 are electrically coupled together as are the Schottky barrier diode anode 36 and Schottky barrier diode cathode 56.

If the voltage on the gate electrode members is established to be a low, say at ground potential, then the n-channel portion of the circuit will not conduct current. N-channel DMOS transistor 70 will be cut-off because there will be insufficient gate voltage to invert the channel region. Because no charge will be flowing in the gate region of the DMOS transistor 70 the bipolar 72 will be cut-off. Because no charge will be flowing in the source region the bipolar transistor 74 will be cut-off.

On the other hand, the low gate voltage will activate the p-channel DMOS transistor 90. The current flowing through the channel region will induce the bipolar transistor to operate. The current flow will also reduce the resistance of each of the resistors 98 and 96. The current flowing through the resistor 96 from the collector of the transistor 92 and the drain of transistor 90 will saturate the transistor 94.

Referring to FIG. 1 the current flowing from the source to drain will be a combination of majority and minority carriers. The majority carriers are introduced in the normal way. As discussed above the minority are introduced by the Schottky barrier diode connection to the drain terminal in the p-channel DMOS transistor. By having a Schottky barrier diode contact to the drain terminal of the p-channel DMOS transistor and to the drain terminal of the n-channel DMOS, one achieves the result of a greatly increased speed of operation of the CMOS transistor pair. The increase in speed is on the order of 5 times faster.

Figure 3:
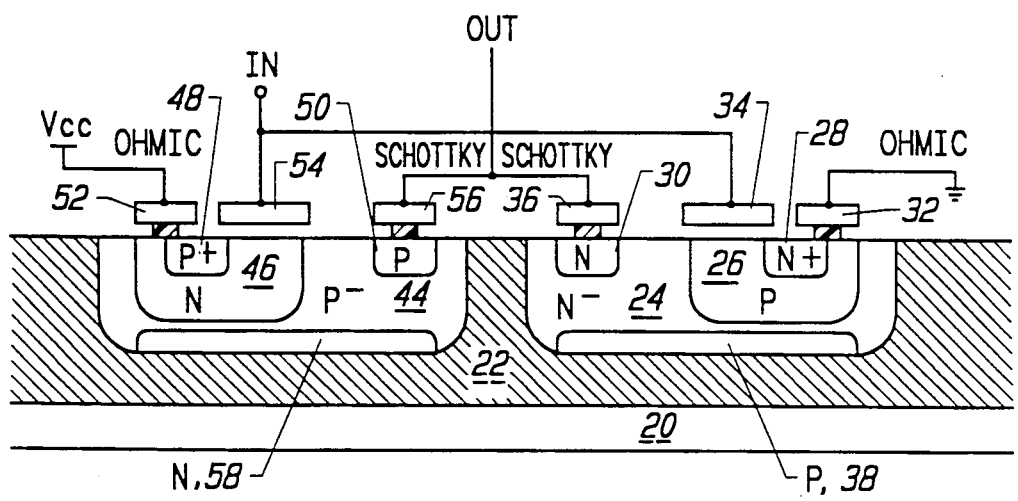
FIG. 3 is a cross-section of a first alternate embodiment of the present invention.
Figure 4:
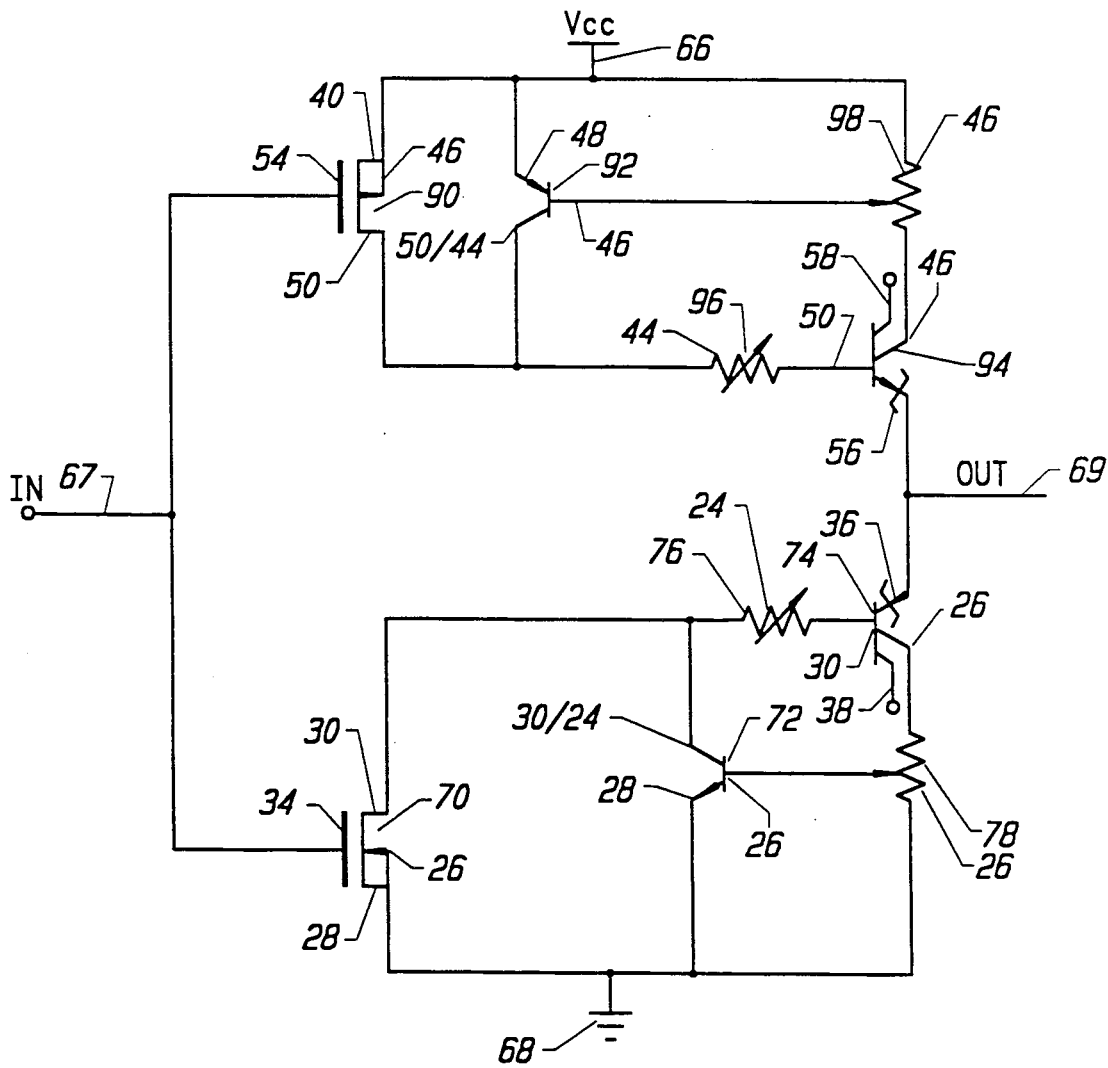
FIG. 4 is an equivalent circuit schematic of the first alternate embodiment of the present invention.

Referring to FIGS. 3 and 4 one can see a first alternate embodiment of the present invention. The figures show each of the same elements, with identical reference numerals, as in FIGS. 1 and 2. However, there is an additional element in each transistor. In the bottom of the n-well 24 a p-type injector 38 is formed. The buried layer 38 is at least underneath that portion of well 26 which extends between n-type pocket 28 and n-type pocket 30. Preferably, the injector 38 extends from n-type pocket 28 to n-type pocket 30. The buried layer operates as an additional source of minority carriers.

In the bottom of the p-well 44 an p-type buried layer 58 is formed. The buried layer 58 is at least underneath that portion of well 46 which extends between p-type pocket 48 and that edge of n-well 46 which is closest to p-type pocket 50. Preferably, the buried layer 58 extends from p-type pocket 48 to p-type pocket 50. The buried layer operates as an additional source of minority carriers. The use of buried layers 38 and 58 will increase the speed of operation of the device.

Figure 5:
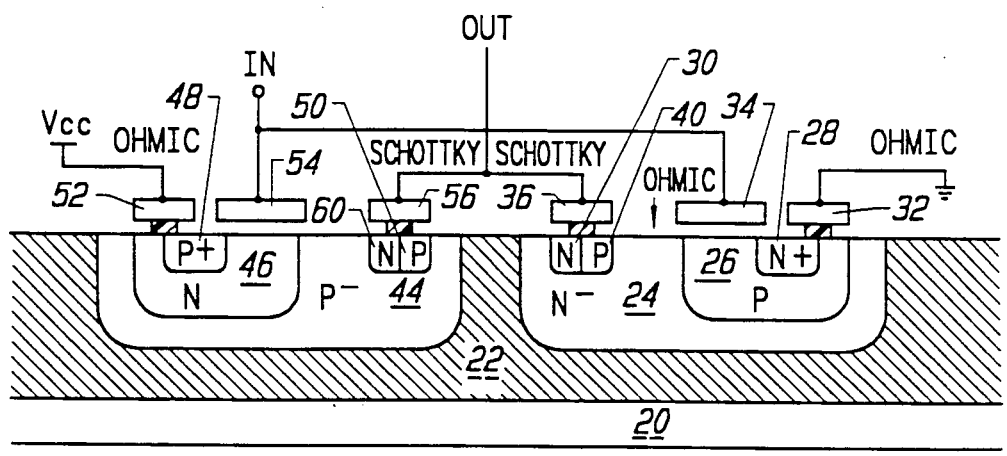
FIG. 5 is a cross-section of a second alternate embodiment of the present invention.
Figure 6:
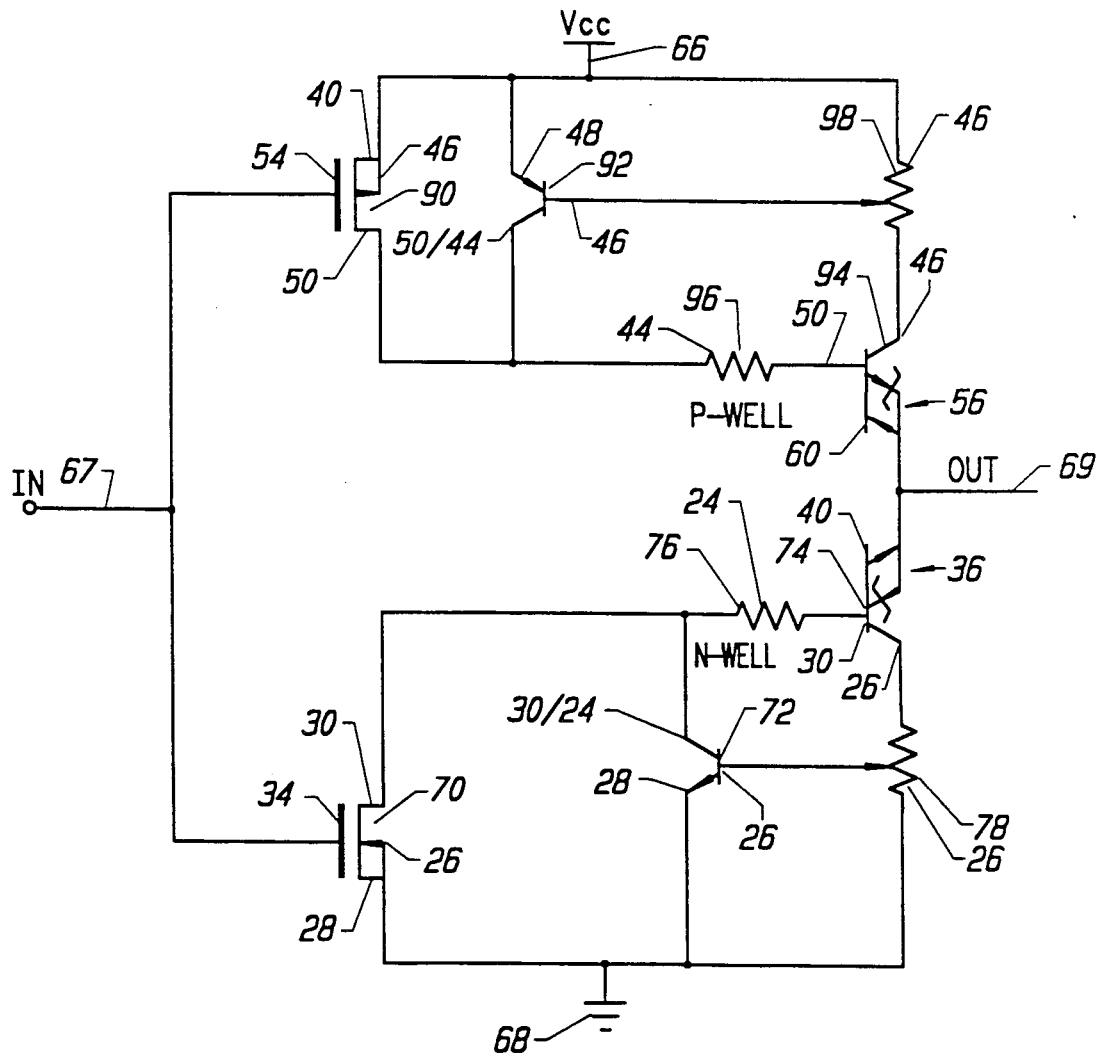
FIG. 6 is an equivalent circuit of the second alternate embodiment of the present invention.

Referring to FIGS. 5 and 6 one can see a second alternate embodiment of the present invention. The figures show each of the same elements, with identical reference numerals, as in FIGS. 1 and 2. However, there is an additional element in each transistor. In the n-channel DMOS transistor a p-type pocket 40 is formed immediately adjacent to the n-type pocket 30. The Schottky contact 36 is formed to both the n-type pocket 30 and ohmic to the p-type pocket 40. The additional p-type diode is shown as an additional emitter to transistor 74 in FIG. 6. This device operates faster than the device of FIG. 1 but can be used with junctions without latch up.

In the p-channel DMOS transistor an n-type pocket 60 is formed immediately adjacent to the p-type pocket 50. The Schottky contact 56 is formed to the p-type pocket 50 and ohmic to the n-type pocket 60. The additional n-type diode is shown as an additional emitter to transistor 94 in FIG. 6. This device operates faster than the device of FIG. 1 but can be used with junction isolation.

An improved CMOS transistor pair utilizing DMOS transistor technology is disclosed which operates faster through the use of Schottky contacts to the n-channel drain and the p-channel drain, due to a marked increase in the transconductance of each transistor without any resulting increase in drain to gate capacitance.

What is claimed is:

1. A complementary metal oxide semiconductor (CMOS) transistor pair structure comprising
   a p-channel transistor including a p-doped source, and ohmic contact to said p-doped source, a p-doped drain,
   a Schottky contact to said p-doped drain, an n-doped channel between said p-doped source and said p-doped drain, and a gate electrode overlying and insulatively spaced from said channel region,
   an n-channel transistor including an n-doped source, an ohmic contact to said n-doped source, an n-doped drain,
   a Schottky contact to said n-doped drain, a p-doped channel between said n-doped source and said n-doped drain and a gate electrode overlying and insulatively spaced from said channel region,
   a first voltage potential terminal connected to said ohmic contact to said p-doped source region,
   a second voltage potential terminal connected to said ohmic contact to said n-doped source region,
   an input terminal connected to said gate electrodes, and an output terminal serially connected to said drains through said Schottky contacts.

2. A double diffused complementary metal oxide semiconductor (CMOS) transistor pair structure comprising
   a semiconductor body having a major surface,
   a p-channel MOS transistor in said semiconductor body including
      a p-doped first device region in said semiconductor body and abutting said major surface,
      an n-doped region in said p-doped first device region,
      a p-doped source region in said n-doped region,
      an ohmic contact to said p-doped source region,
      a p-doped drain region in said p-doped first device region and spaced from said n-doped region,
      a Schottky contact to said p-doped drain region, and
      a gate electrode over and insulatively spaced from said n-doped region between said p-doped source region and said p-doped drain region,
   an n-channel MOS transistor in said semiconductor body including
      an n-doped second device region in said semiconductor body and abutting said major surface,
      a p-doped region in said n-doped second device region,
      an n-doped source region in said p-doped region,
      an ohmic contact to said n-doped source region, an n-doped first drain region and spaced from said p-doped region, a Schottky contact to said n-doped drain region, and a gate electrode over and insulatively spaced from said p-doped region between said n-doped source region and said n-doped drain region, means connecting a first voltage potential to said ohmic contact to said p-doped source region, means connecting a second voltage potential to said ohmic contact to said n-doped source region, means connecting an input to gate electrodes, and means serially connecting an output through said Schottky contacts to said drains.

3. A complementary-double-diffused-metal-oxide-semiconductor transistor pair comprising:

a semiconductor substrate having a top surface and a bottom surface, an insulating layer positioned on said top surface, an n-channel DMOS transistor comprising:

a first well of n-type silicon semiconductor, a second well of p-type silicon contained entirely within said first well, a first pocket of n-type silicon contained entirely within said second well, a second pocket of n-type silicon contained entirely within said first well and spaced apart from said second pocket, a third pocket of p-type silicon immediately adjacent said second pocket forming a first p-n junction between said second pocket and said third pocket, positioned toward said second well but spaced apart from said second well, a first ohmic contact formed to said first pocket and to said second well electrically connecting said first pocket and said second well to a same first electrical potential, a first insulated gate electrode member formed over a region of said second well extending from an edge of said second well facing toward said third pocket to said first pocket, and a first conductive material formed over a portion of said p-n junction between said second pocket and said third pocket forming a Schottky barrier junction diode to said second pocket and an ohmic contact to said third pocket, a p-channel DMOS transistor comprising:

a third well of p-type silicon semiconductor, a fourth well of n-type silicon contained entirely within said third well, a fourth pocket of p-type silicon contained entirely within said fourth well, a fifth pocket of p-type silicon contained entirely within said third well and spaced apart from said fourth pocket, a sixth pocket of n-type silicon immediately adjacent said fifth pocket forming a second p-n junction between said fifth pocket and said sixth pocket, positioned toward said fourth well but spaced apart from said fourth well, a second ohmic contact formed to said fourth pocket and to said fourth well electrically connecting said fourth pocket and said fourth well to a same second electrical potential, a second insulated gate electrode member formed over a region of said fourth well extending from an edge of said fourth well facing toward said sixth pocket to said fourth pocket, and a second conductive material formed over a portion of said second p-n junction between said fifth pocket and said sixth pocket forming a Schottky barrier junction diode to said fifth pocket and an ohmic contact to said sixth pocket and being electrically coupled to said first conductive material, and an isolating insulating region formed between said p-channel DMOS transistor and said n-channel DMOS transistor.

4. A pair of complementary-metal-oxide-semiconductor transistors comprising:

a silicon semiconductor substrate having a top surface and a bottom surface, an insulating layer of silicon dioxide positioned on said top surface, an n-channel DMOS transistor comprising:

a first well of n-type silicon semiconductor, a second well of p-type silicon contained entirely within said first well, a first pocket of n-type silicon contained entirely within said second well, a second pocket of n-type silicon contained entirely within said first well and spaced apart from said second pocket, a third pocket of p-type silicon immediately adjacent said second pocket forming a first p-n junction between said second pocket and said third pocket, positioned toward said second well but spaced apart from said second well, a first ohmic contact formed to said first pocket and to said second well electrically connecting said first pocket and said second well to a same first electrical potential, a first insulated gate electrode member formed over a region of said second well extending from an edge of said second well facing toward said third pocket to said first pocket, and a first conductive material formed over a portion of said p-n junction between said second pocket and said third pocket forming a Schottky barrier junction diode to said second pocket and an ohmic contact to said third pocket, a p-channel DMOS transistor comprising:

a third well of p-type silicon semiconductor, a fourth well of n-type silicon contained entirely within said third well, a fourth pocket of p-type silicon contained entirely within said fourth well, a fifth pocket of p-typed silicon contained entirely within said third well and spaced apart from said fourth pocket, a sixth pocket of n-type silicon immediately adjacent said fifth pocket forming a second p-n junction between said fifth pocket and said sixth pocket, positioned toward said fourth well but spaced apart from said fourth well, a second ohmic contact formed to said fourth pocket and to said fourth well electrically connecting said fourth pocket and said fourth well to a same second electrical potential, a second insulated gate electrode member formed over a region of said fourth well extending from an edge of said fourth well facing toward said sixth pocket to said fourth pocket, and a second conductive material formed over a portion of said second p-n junction between said fifth pocket and said sixth pocket forming a Schottky barrier junction diode to said fifth pocket and an ohmic contact to said sixth pocket and being electrically coupled to said first Schottky barrier junction diode, and an isolating insulating region formed between said p-channel DMOS transistor and said n-channel DMOS transistor.

* * * * *